United States Patent
Lim et al.

(10) Patent No.: US 8,901,581 B2
(45) Date of Patent: Dec. 2, 2014

(54) SEMICONDUCTOR LIGHT EMITTING DEVICE HAVING MULTI-CELL ARRAY AND MANUFACTURING METHOD THEREOF, LIGHT EMITTING MODULE, AND ILLUMINATION APPARATUS

(71) Applicant: Samsung Electronics Co., Ltd., Suwon-si (KR)

(72) Inventors: Chan Mook Lim, Gyeonggi-do (KR); Jong Ho Lee, Gyeonggi-do (KR); Jin Hwan Kim, Gyeonggi-do (KR); Jin Hyun Lee, Gyeonggi-do (KR); Su Hyun Jo, Gyeonggi-do (KR); Hae Yeon Hwang, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/895,051

(22) Filed: May 15, 2013

(65) Prior Publication Data

US 2013/0306997 A1  Nov. 21, 2013

(30) Foreign Application Priority Data

May 18, 2012 (KR) .......................... 10-2012-0052926

(51) Int. Cl.
- *H01L 29/18* (2006.01)
- *H01L 25/075* (2006.01)
- *H01L 27/15* (2006.01)
- *H01L 33/62* (2010.01)

(52) U.S. Cl.
CPC .......... *H01L 27/156* (2013.01); *H01L 25/0753* (2013.01); *H01L 2224/24* (2013.01); *H01L 2224/48091* (2013.01); *H01L 33/62* (2013.01)
USPC ................... 257/88; 257/13; 257/79; 257/82; 257/E33.001

(58) Field of Classification Search
USPC ........................... 257/88, 13, 79, 82, E33.001
See application file for complete search history.

(56) References Cited

U.S. PATENT DOCUMENTS

2005/0254243 A1* 11/2005 Jiang et al. ..................... 362/249
2011/0049537 A1* 3/2011 Lee et al. ......................... 257/88

FOREIGN PATENT DOCUMENTS

| KR | 10-2008-0006160 A | 1/2008 |
| KR | 10-2011-0103608 A | 9/2011 |
| KR | 10-2011-0138980 A | 12/2011 |

* cited by examiner

*Primary Examiner* — Timor Karimy
(74) *Attorney, Agent, or Firm* — McDermott Will & Emery LLP

(57) ABSTRACT

A semiconductor light emitting device includes a substrate and a plurality of light emitting cells disposed on the substrate. Each light emitting cell includes first and second conductive semiconductor layers having an active layer formed therebetween, and first and second electrodes formed on the first and second layers. A first insulation layer is formed on portions of the light emitting cell, while a second insulation layer entirely covers at least one light emitting cell. A method of manufacturing the semiconductor light emitting device, and a light emitting module and an illumination apparatus including the semiconductor light emitting device are also provided.

10 Claims, 9 Drawing Sheets

SEMICONDUCTOR LIGHT EMITTING DEVICE HAVING MULTI-CELL ARRAY AND MANUFACTURING METHOD THEREOF, LIGHT EMITTING MODULE, AND ILLUMINATION APPARATUS

CROSS-REFERENCE TO RELATED APPLICATIONS

This application claims the priority of Korean Patent Application No. 10-2012-0052926 filed on May 18, 2012, in the Korean Intellectual Property Office, the disclosure of which is incorporated herein by reference.

BACKGROUND OF THE INVENTION

1. Field of the Invention

The present invention relates to a semiconductor light emitting device having a multi-cell array and a manufacturing method thereof, a light emitting module including the semiconductor light emitting device having a multi-cell array, and an illumination apparatus including the light emitting module.

2. Description of the Related Art

In general, semiconductor light emitting diodes (LEDs) are advantageous as light sources in terms of power efficiency and reliability. Therefore, semiconductor LEDs are being actively developed as high-power, high-efficiency light sources for various illumination apparatuses as well as for backlight units of display devices.

For the commercialization of such semiconductor LEDs as illumination light sources, it is necessary to increase their light efficiency and reduce their production cost while increasing their power to a desired level.

However, a high-power LED using a high-rated current may have low light efficiency due to a high current density, as compared to a low-power LED using a low-rated current.

Specifically, if a current rating of an LED chip is increased to obtain high luminous flux (e.g., as compared to an LED chip of the same area) and to obtain high power, the light efficiency may be degraded due to an increase in the current density. Also, light efficiency degradation is further accelerated due to heat generated by the device, thereby resulting in a decrease in luminance of the semiconductor light emitting device.

SUMMARY OF THE INVENTION

An aspect of the present invention provides a semiconductor light emitting device having improved luminance and a manufacturing method thereof.

According to an aspect of the present invention, a semiconductor light emitting device includes: a substrate, a plurality of light emitting cells disposed on the substrate, wherein each light emitting cell includes a first conductive semiconductor layer and wherein at least a portion of the first conductive semiconductor layer has an active layer and a second conductive semiconductor layer disposed on a top surface thereof; first and second electrodes disposed on the first and second conductive semiconductor layers, respectively, of each light emitting cell among the plurality of light emitting cells; an interconnection part connecting the first or second electrode of one light emitting cell to the first or second electrode of another light emitting cell adjacent to the one light emitting cell among the plurality of light emitting cells; a first insulation layer covering a surface of at least one light emitting cell among the plurality of light emitting cells and disposed on at least a portion of a surface of the light emitting cell other than a portion thereof facing the first electrode; and a second insulation layer disposed on the first insulation layer so as to entirely cover at least one light emitting cell among the plurality of light emitting cells.

The first insulation layer in each light emitting cell may not be formed between the first electrode and a side surface of the light emitting cell facing the first electrode.

The first insulation layer and the second insulation layer may be formed of silicon oxide or silicon nitride.

The semiconductor light emitting device may further include a transparent electrode disposed on a top portion of the second conductive semiconductor layer of each light emitting cell.

The first and second electrodes may be disposed on top surfaces of each light emitting cell.

The first insulation layer may be not formed on the second conductive semiconductor layer having the second electrode disposed thereon in each light emitting cell.

At least two light emitting cells may be interconnected in series by the light emitting cells' first and second electrodes, and the series interconnection of the at least two light emitting cells may be coupled between a positive terminal and a negative terminal of the semiconductor light emitting device. In one example, a first series interconnection of at least two light emitting cells is coupled in parallel with a second series interconnection of at least two light emitting cells between the positive terminal and the negative terminal of the semiconductor light emitting device.

The active layer and the second conductive semiconductor layer of each light emitting cell can be disposed in a U-shape pattern on the top surface of the light emitting cell, and the first electrode can be disposed in the gap of the U-shape pattern on the top surface of the light emitting cell. Additionally, the first insulation layer may be disposed on each light emitting cell such that the first insulation layer does not cover any portion of the gap in the U-shape pattern.

According to another aspect of the present invention, a manufacturing method for manufacturing a semiconductor light emitting device includes steps of: sequentially forming a first conductive semiconductor layer, an active layer, and a second conductive semiconductor layer on a substrate; performing isolation processes on respective regions of the first and second conductive semiconductor layers and the active layer spaced apart from each other at predetermined intervals to form a plurality of light emitting cells each including first and second conductive semiconductor layers and an active layer formed therebetween; performing mesa etching on respective regions of the second conductive semiconductor layer and the activate layer of each light emitting cell such that portions of the active layer and the second conductive semiconductor layer are removed to expose a portion of a top surface of the first conductive semiconductor layer; forming a first insulation layer on a surface of at least a portion of each of the plurality of light emitting cells other than (i) the exposed portion of the top surface of the first conductive semiconductor layer and (ii) a portion adjacent to the exposed portion and formed in a side surface of each of the plurality of light emitting cells; forming a first electrode on the exposed portion of the top surface of the first conductive semiconductor layer of each light emitting cell and forming a second electrode on a top surface of the second conductive semiconductor layer of each light emitting cell; and forming a second insulation layer on the first insulation layer so as to entirely cover each light emitting cell.

The first insulation layer may be not formed between the first electrode and the side surface of each light emitting cell adjacent to the exposed portion of the top surface of the first conductive semiconductor layer.

The first insulation layer and the second insulation layer may be formed of silicon oxide or silicon nitride.

The manufacturing method may further include forming a transparent electrode on a top portion of the second conductive semiconductor layer.

The first and second electrodes can be formed on top surfaces of each light emitting cell.

The manufacturing method may further include forming an interconnection part connecting the first or second electrode of one light emitting cell to the first or second electrode of another light emitting cell adjacent to the one light emitting cell among the plurality of light emitting cells, after the forming of the first electrode and the forming of the second electrode.

At least two light emitting cells can be interconnected in series by the manufacturing method by forming interconnection parts to connect the light emitting cells' first and second electrodes, such that the at least two light emitting cells form a first series interconnection between a positive terminal and a negative terminal of the semiconductor light emitting device. In addition, the first series interconnection of at least two light emitting cells can be coupled in parallel with a second series interconnection of at least two light emitting cells between the positive terminal and the negative terminal of the semiconductor light emitting device.

The manufacturing method may form the active layer and the second conductive semiconductor layer of each light emitting cell using the mesa etching process into a U-shape pattern on the top surface of each light emitting cell, and form the first electrode in the gap of the U-shape pattern on the top surface of the light emitting cell. Additionally, the first insulation layer can be formed on each light emitting cell such that the first insulation layer does not cover any portion of the gap in the U-shape pattern.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
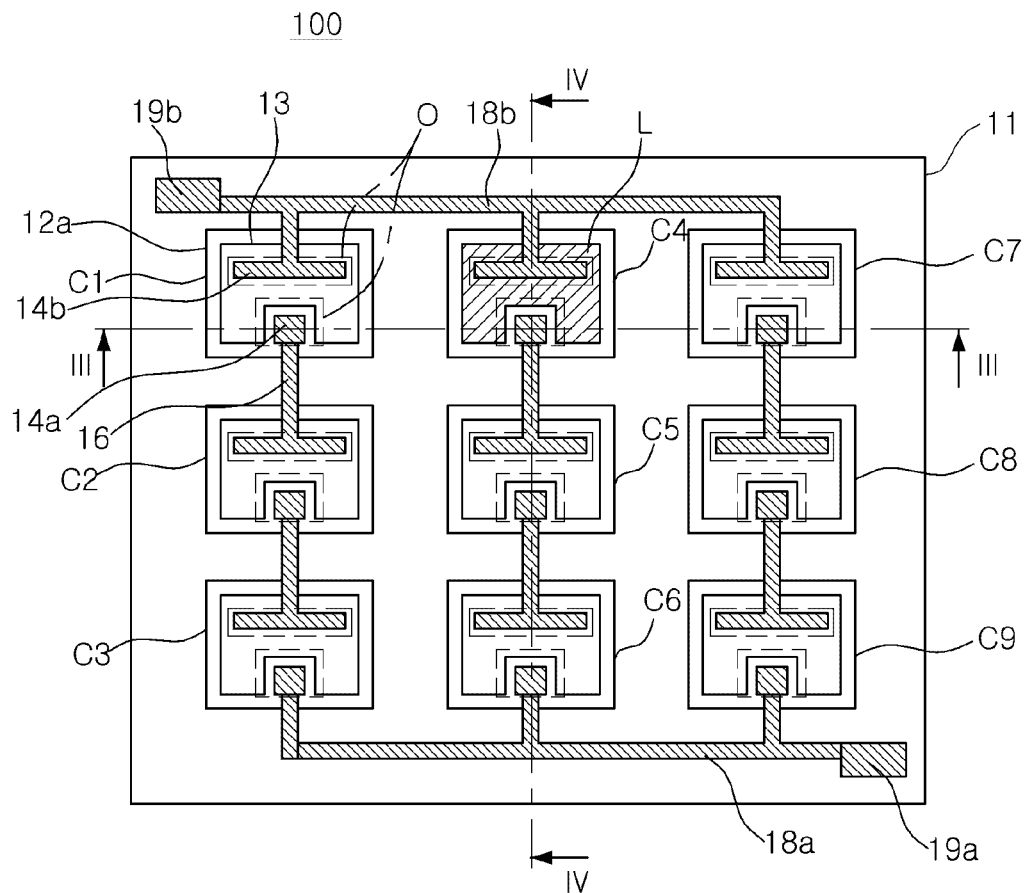
FIG. 1 shows a top planar view of a semiconductor light emitting device having a multi-cell array according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

Figure 2:
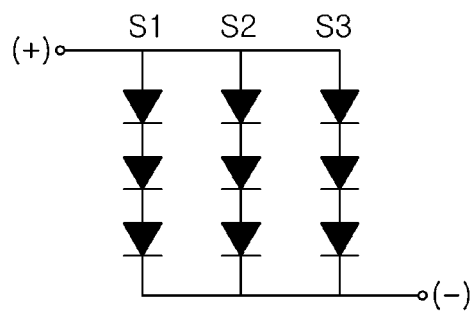
FIG. 2 shows an illustrative equivalent circuit diagram of a multi-cell array implemented in the semiconductor light emitting device of FIG. 1.
Figure 3:
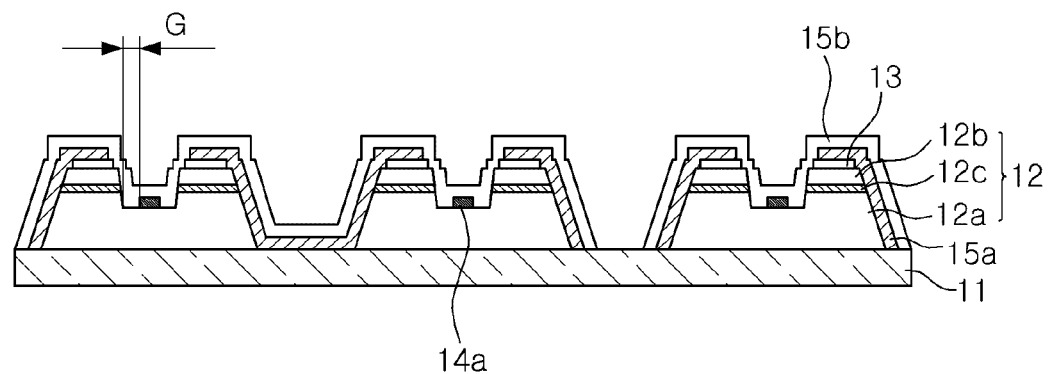
FIG. 3 shows a side cross-sectional view of the semiconductor light emitting device of FIG. 1 taken along the line III-III shown in FIG. 1.
Figure 4:
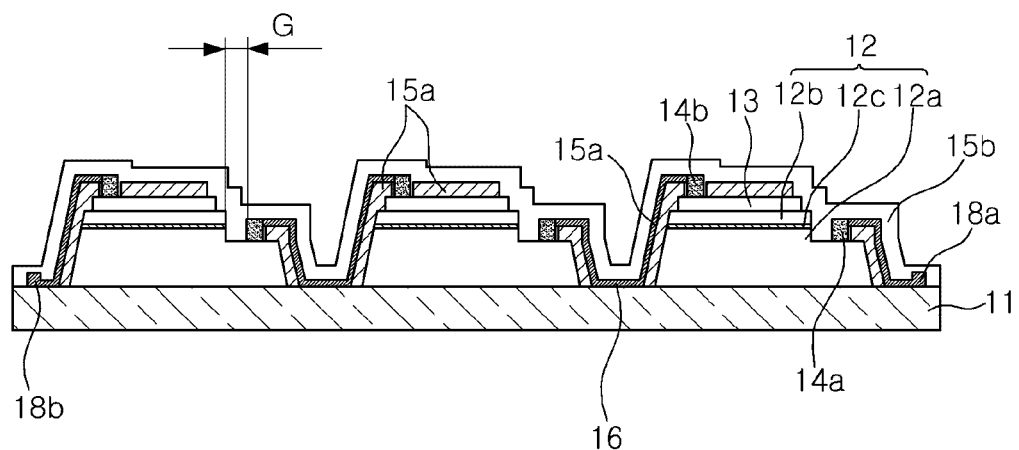
FIG. 4 shows a side cross-sectional view of the semiconductor light emitting device of FIG. 1 taken along the line VI-VI shown in FIG. 1.

FIG. 1 shows a top planar view of a semiconductor light emitting device having a multi-cell array according to an embodiment of the present invention. FIG. 2 shows an illustrative equivalent circuit diagram of a multi-cell array implemented in the light emitting device of FIG. 1. FIG. 3 shows a side cross-sectional view of the semiconductor light emitting device of FIG. 1 taken along the line III-III shown in FIG. 1. FIG. 4 shows a side cross-sectional view of the semiconductor light emitting device of FIG. 1 taken along the line VI-VI shown in FIG. 1.

Referring to FIG. 1, a semiconductor light emitting device 100 according to an embodiment of the present invention includes a substrate 11, and a plurality of light emitting cells C1-C9 disposed in a 3×3 array on a top surface of the substrate 11.

The term 'light emitting cell' used herein generally refers to a semiconductor multilayer film having an active layer region.

As shown in FIGS. 3 and 4, each light emitting cell of the plurality of light emitting cells C1-C9 may be formed by manufacturing a semiconductor multilayer film 12 on the substrate 11, wherein the semiconductor multilayer film 12 includes a first conductive semiconductor layer 12a, an active layer 12c, and a second conductive semiconductor layer 12b sequentially formed on the top surface of the substrate 11.

As shown in the embodiment of FIG. 3, a cell isolation process can be performed to entirely remove the semiconductor multilayer film 12 (a complete isolation process) from the substrate 11 in regions separating different light emitting cells, so as to expose the surface of the substrate 11 in the separation regions. Additionally or alternatively, the first conductive semiconductor layer 12a may have an exposed region through partial isolation (a mesa etching process).

With reference to FIGS. 1, 3, and 4, in each of the light emitting cells C1-C9, the first conductive semiconductor layer 12a may have a region partially exposed through mesa etching.

A transparent electrode 13 may be formed on a top surface of the second conductive semiconductor layer 12b. Here, the transparent electrode 13 may be formed of a transparent conductive material such as ITO or ZnO.

A first electrode 14a and a second electrode 14b respectively connected to the first conductive semiconductor layer 12a and to the transparent electrode 13 may be formed in each of the light emitting cells C1-C9.

FIG. 1 illustratively shows the first electrode 14a and the second electrode 14b being formed in parallel at regular intervals to provide uniform current distribution in each of the light emitting cells C1-C9; however, the present invention is not limited thereto, and the first electrode 14a and the second electrode 14b can more generally be formed to include various additional structures and/or to be disposed in various other configurations.

As illustrated in the equivalent circuit diagram of FIG. 2, the semiconductor light emitting device according to the present embodiment has a series-parallel connection structure in which sets of three light emitting cells are connected in series to each other in each of columns S1~S3 (e.g., sets of light emitting cells C1-C3 in column S1, C4-C6 in column S2, and C7-C9 in column S3), and the three columns S1~S3 are connected in parallel to each other between a positive (+) and a negative (−) terminal.

In accordance with this connection structure, the number of light emitting cells connected in series to each other may be selected according to voltage standards and is not limited to connecting three light emitting cells in series as shown in FIGS. 1 and 2. That is, the number of light emitting cells connected in series to each other in each column is determined to satisfy desired voltage standards, and various numbers of light emitting cells (e.g., 1, 2, 4, 5, or more) can be connected in series in each column. Additionally, the number of columns connected in parallel to each other is not limited to connecting three columns in parallel as shown in FIGS. 1 and 2. That is, the number of columns connected in parallel to each other can be controlled to provide a desired output, and various numbers of columns (e.g., 1, 2, 4, 5, or more) can be connected in parallel. In one example, each column may have the same number of light emitting cells (e.g., as shown in FIGS. 1 and 2).

In order to connect the light emitting cells, a plurality of interconnection parts 16 may be formed between the respective electrodes of the light emitting cells adjacent to each other, the interconnection parts 16 connecting the respective electrodes having opposite polarities of the light emitting cells adjacent to each other. That is, as illustrated in FIG. 1, each of the interconnection parts 16 may connect the electrodes having opposite polarities of the light emitting cells adjacent to each other to realize series connection of the light emitting cells. Specifically, as illustrated in FIG. 1, in the plurality of light emitting cells C1-C9, the first electrode 14a of one light emitting cell C1 and the second electrode 14b of another light emitting cell C2 adjacent thereto may be connected to each other through the interconnection part 16.

In the embodiment, in order to prevent an undesirable region of a corresponding light emitting cell C1-C9 from contacting the interconnection part 16, each light emitting cell C1-C9 may have first and second insulation layers 15a and 15b formed on a side and/or top surface thereof. The first and second insulation layers 15a and 15b may be formed of silicon oxide or silicon nitride. In particular, the first isolation layer 15a may isolate the side surface of the light emitting cell and the interconnection part 16 from each other.

Specifically, as illustrated in FIGS. 3 and 4, the first insulation layer 15a is formed on an top portion of the transparent electrode 13 and a portion of the side surface of the light emitting cell exposed through mesa etching and which does not face the first electrode 14a, to thereby isolate the side surface of the corresponding light emitting cell and the interconnection part 16 from each other.

The reference numeral "O" and the dashed rectangles shown in FIG. 1 refer to an open region of the first insulation layer 15a. That is, the first insulation layer 15a is not formed inside the open region identified by O and located within the dashed rectangles. As shown in FIG. 1, in general the first insulation layer 15a is disposed on each light emitting cell such that the first insulation layer 15a does not cover any portion of a gap etched in the U-shaped pattern active layer 12c and in the U-shaped pattern second conductive semiconductor layer 12b and within which the first electrode 14a is disposed.

As described above, when the first insulation layer 15a is not formed on a portion of the side surface of the light emitting cell exposed through mesa etching, the portion facing the first electrode 14a, the active layer 12c of the semiconductor multilayer film 12 may be widened by a distance equal to a thickness of the first insulation layer 15a in a direction toward the first electrode 14a, as compared to the case in which the first insulation layer 15a is formed on a portion of the side surface of the light emitting cell exposed through mesa etching, the portion facing the first electrode 14a. That is, a process margin is secured when the first insulation layer 15a is not formed on a portion of the side surface of the light emitting cell facing the first electrode 14a, such that a light emitting region, i.e. the active layer 12c, may be more widely formed.

Specifically, when a predetermined interval G is formed between the side surface of the light emitting cell exposed through mesa etching and the first electrode 14a, the area of the active layer 12c is widened as compared to the case in which the insulating layer is interposed between the side surface of the light emitting cell and the first electrode 14a, whereby luminance of the light emitting device increases and consequently, an operation voltage thereof may be improved. In the light emitting cell denoted as reference numeral C4 in FIG. 1, a formation region of the active layer 12c is indicated as a region shown by hash lines and identified by the reference numeral "L". In this manner, the area of the active layer 12c is widened to increase luminance of the light emitting device, thereby improving the operation voltage thereof. As shown, the area of the active layer 12c identified by the reference numeral "L", which also corresponds to the area of the second conductive semiconductor layer 12b, is disposed in a U-shape pattern on the top surface of each light emitting cell (as shown by reference numeral "L" for cell C4, and by analogy on the remaining cells C1-C3 and C5-C9). The first electrode 14a is disposed in the gap of the U-shape pattern on the top surface of the light emitting cell.

In addition, the second insulation layer 15b is formed to cover the side surface of the light emitting cell exposed through mesa etching and the first electrode 14a. The second insulation layer 15b may isolate the first electrode 14a and the side surface of light emitting cell from each other. As illustrated in the drawings, the second insulation layer 15b may be used as a passivation layer provided on almost an entire side surface of each light emitting cell.

The second insulation layer 15b is not illustrated in FIG. 1 in order to clearly describe positional relationships of the plurality of electrodes, the plurality of interconnection parts, the transparent electrode, and the first insulation layer.

In each light emitting cell C1-C9 of the semiconductor light emitting device having a multi-cell array, the insulation layers may be formed to include two layers, the first insulation layer 15a and the second insulation layer 15b, such that a process margin is secured to increase the area of the active layer 12c, thereby improving luminance of the semiconductor light emitting device.

Each of the interconnection parts 16 used in the embodiment may be connected to the first electrode 14a of the light emitting cells C3, C6, and C9 located at one end of each column and extended along the first insulation layer 15a to be connected to a first connection part 18a. In a similar manner, the second electrode 14b of the light emitting cells C1, C4, and C7 located at an opposite end of each column may be connected to a second connection part 18b through the interconnection part 16.

The first connection part 18a and the second connection part 18b may be connected to respective first and second bonding pads 19a and 19b. Specifically, one electrode of each light emitting cells located at an end of a column of the semiconductor light emitting device may be connected to one of the first and second bonding pads 19a and 19b through the first and second connection parts 18a and 18b.

Here, the first and second bonding pads 19a and 19b may be formed of a metal different from those of the first and second connection parts 18a and 18b and the interconnection parts 16. For example, the first and second bonding pads 19a and 19b may be configured of a general metal layer formed of, for example, chromium/gold (Cr/Au), and the first and second connection parts 18a and 18b and the interconnection parts 16 for wiring may be formed of a metal having excellent reflectivity and conductivity, for example, aluminum (Al), silver (Ag), or the like.

Alternatively, the bonding pads, the connection parts, and the interconnection parts may also be formed using a single metal pattern forming process. That is, the first and second bonding pads 19a and 19b, the first and second connection parts 18a and 18b, and the interconnection parts 16 may be formed of the same metal, for example, chromium/gold (Cr/Au).

As described above, when each light emitting cell is formed such that the wide area of the active layer is secured, the luminance and operating voltage of the light emitting element may be improved.

FIGS. 5A through 5G show a series of views illustrating a process of manufacturing a multi-cell array semiconductor light emitting device according to an exemplary embodiment of the present invention, and particularly illustrating the manufacturing process along a cross-section of the semiconductor light emitting device of FIG. 1 taken along the line III-III shown in FIG. 1. FIGS. 6A through 6G show a series of views illustrating a process of manufacturing a multi-cell array semiconductor light emitting device according to an exemplary embodiment of the present invention, and particularly illustrating the manufacturing process along a cross-section of the semiconductor light emitting device of FIG. 1 taken along the line VI-VI shown in FIG. 1.

Figure 5A:
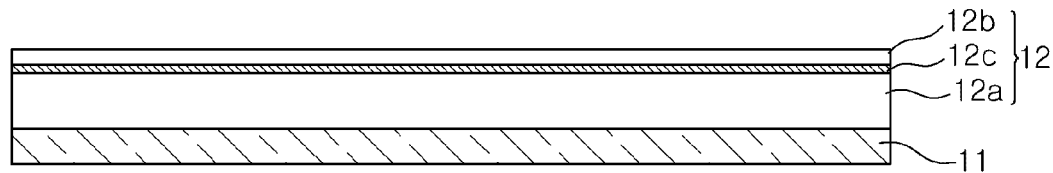
FIGS. 5A through 5G show a series of views illustrating a process of manufacturing a multi-cell array semiconductor light emitting device according to an embodiment of the present invention, and particularly illustrating the manufacturing process along a cross-section of the semiconductor light emitting device of FIG. 1 taken along the line III-III shown in FIG. 1.
Figure 6A:
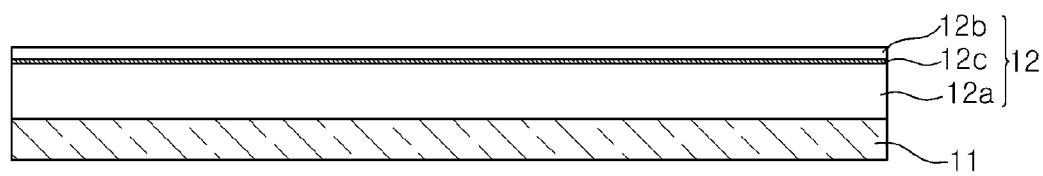
FIGS. 6A through 6G show a series of views illustrating a process of manufacturing a multi-cell array semiconductor light emitting device according to an embodiment of the present invention, and particularly illustrating the manufacturing process along a cross-section of the semiconductor light emitting device of FIG. 1 taken along the line VI-VI shown in FIG. 1.

As illustrated in FIGS. 5A and 6A, the semiconductor multilayer film 12 for light emission is formed on the top surface of the substrate 11. That is, the first conductive semiconductor layer 12a, the active layer 12c, and the second conductive semiconductor layer 12b are sequentially formed on the top surface of the substrate 11.

The substrate 11 may be an insulation substrate such as a sapphire substrate; however, the present invention is not limited thereto. For example, the substrate 11 may be a conductive substrate.

If a conductive substrate is used as the substrate 11, since one electrode of the light emitting cell is connected by the conductive substrate, another electrode of the light emitting cell having a polarity opposite to that of the one electrode may be formed on the top surface of the cell, whereby a wiring connection may be completed.

Figure 5B:
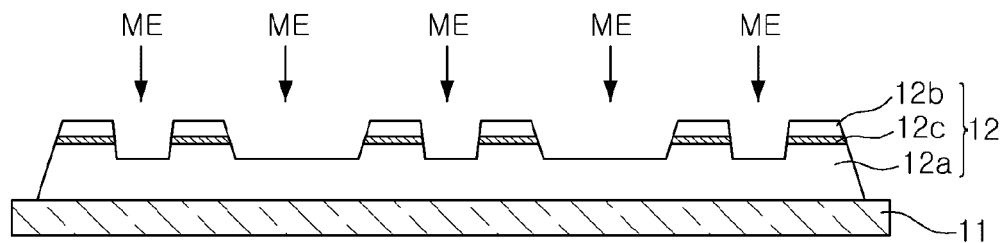
Figure 6B:
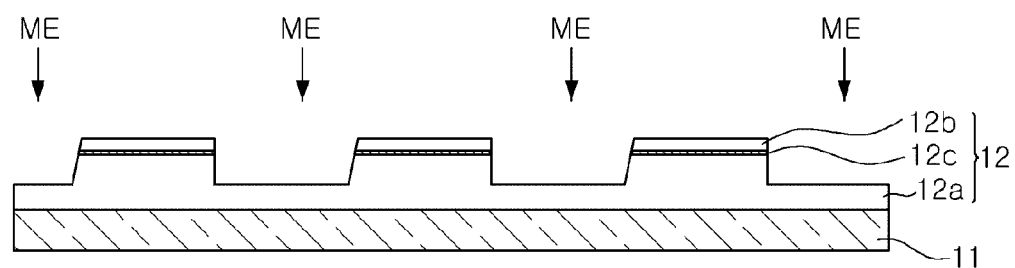

Referring to FIGS. 5B and 6B, mesa etching for primary isolation is performed to selectively remove the second conductive semiconductor layer 12b, the active layer 12c, and a portion of the first conductive semiconductor layer 12a from selected portions of the surface of the semiconductor multilayer film 12, thereby exposing a region of the first conductive semiconductor layer 12a.

In this process, a mesa etching region ME, subjected to mesa etching, includes an isolation region IE and a region on which the first electrode will be formed.

Figure 5C:
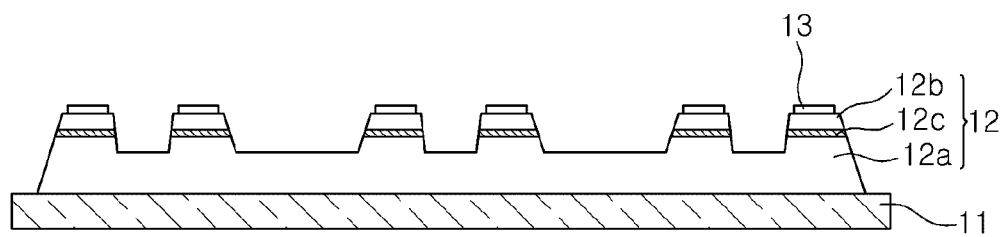
Figure 5D:
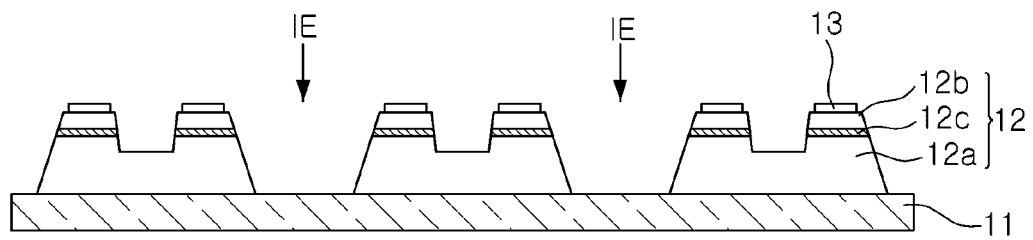
Figure 6C:
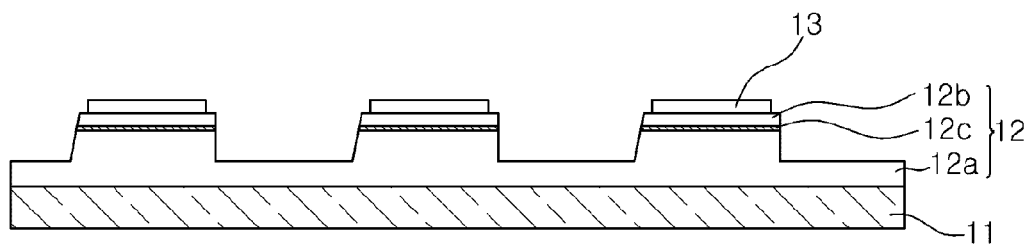

Next, as illustrated in FIGS. 5C and 6C, the transparent electrode 13 may be formed on the top surface of the second conductive semiconductor layer 12b as necessary. Then, in order to obtain the plurality of light emitting cells, the complete isolation process is performed to form the isolation region IE by exposing the surface of the substrate 11, as shown in FIGS. 5D and 6D.

Figure 6D:
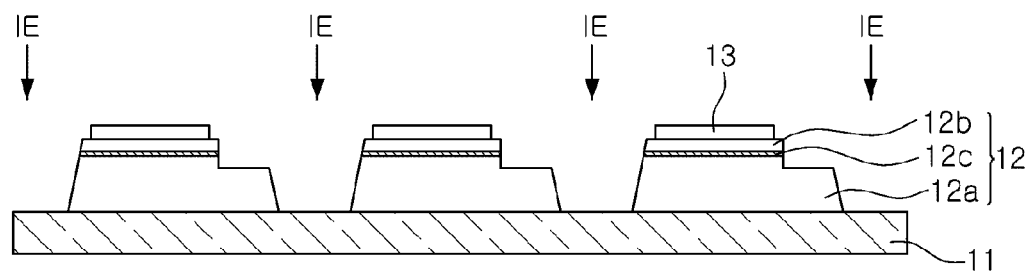

The ordering of the process steps of FIGS. 5B to 5D and of the process steps of FIGS. 6B to 6D may be varied such that the steps can be undertaken in different orders in various embodiments. For example, although the embodiments illustrate that the complete isolation process (e.g., shown in FIGS. 5D and 6D) is performed after the mesa etching process (e.g., shown in FIGS. 5B and 6B), the mesa etching process may be performed separately after performing the complete isolation process.

Also, the process of forming the transparent electrode may be omitted, and even in the case in which the transparent electrode is formed, the order of step for forming the transparent electrode may be changed with other steps in the manufacturing processes. For example, the transparent electrode may be formed after the complete isolation process.

Figure 5E:
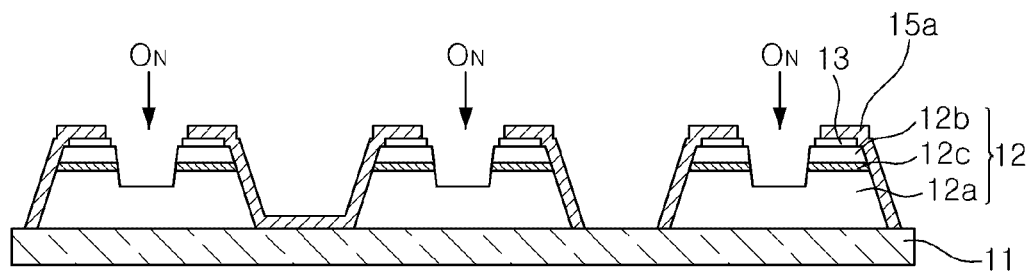
Figure 6E:
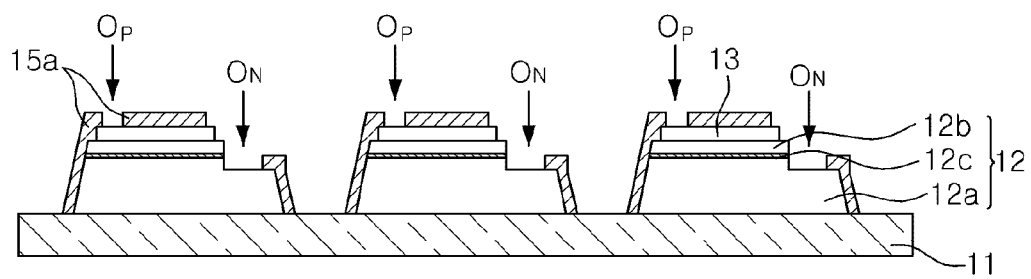

Referring to FIGS. 5E and 6E, the insulating layer 15a is formed, and in order to form the first and second electrodes 14a and 14b, an open region $O_N$ is formed to selectively expose the side surface of each light emitting cell C1-C9 and the first conductive semiconductor layer 12a and an open region $O_P$ is formed to selectively expose the top surface of the transparent electrode 13.

Specifically, in the side surface of each light emitting cell C1-C9 formed through mesa etching, a portion thereof surrounding a region on which the first electrode 14a will be formed is left exposed. In particular, the region that is left exposed includes a region in which the first conductive semiconductor layer 12a is exposed and on which the first electrode 14a will be formed. Also, a portion of the top surface of the transparent electrode 13, on which the second electrode 14b will be formed, may be exposed.

Figure 5F:
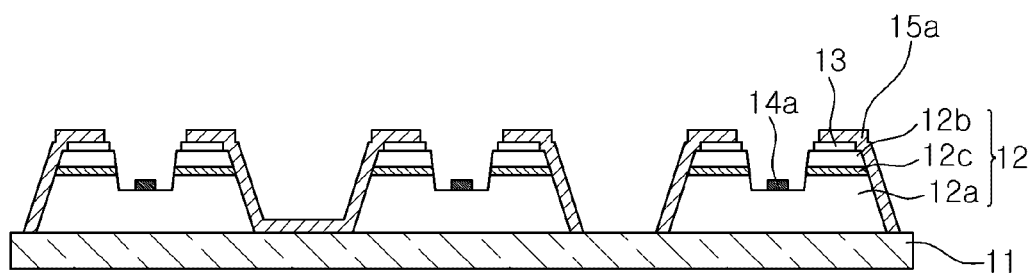
Figure 6F:
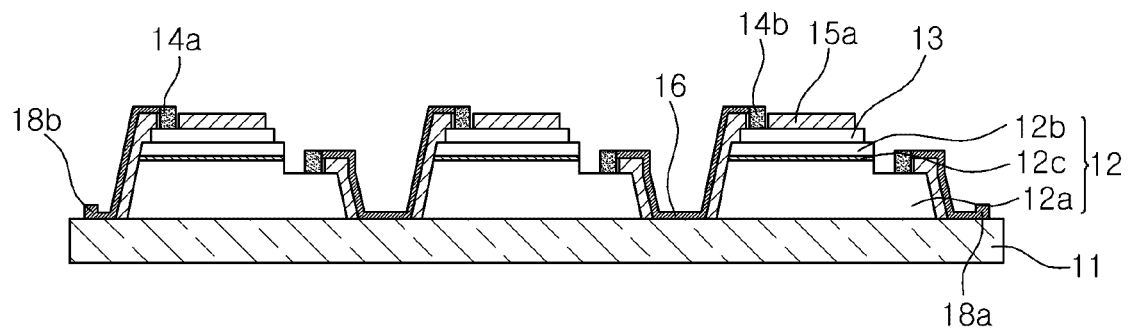

Thereafter, as illustrated in FIGS. 5F and 6F, the first and second electrodes 14a and 14b are formed and the first and second connection parts 18a and 18b and the interconnection parts 16 for wiring are formed. In order to realize the series connection as in the embodiment, each interconnection part 16 may connect the first conductive semiconductor layer 12a of one light emitting cell and the second conductive semiconductor layer 12b of an adjacent light emitting cell to each other.

Figure 5G:
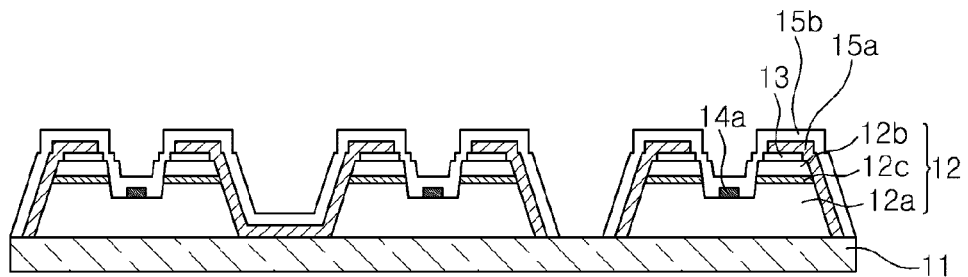
Figure 6G:
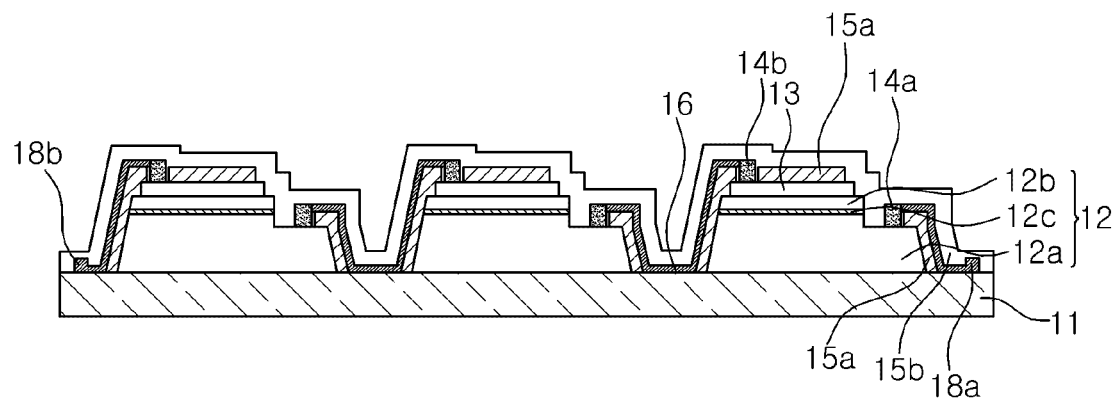

Next, as illustrated in FIGS. 5G and 6G, the second insulation layer 15b is formed to entirely cover the first and second electrodes 14a and 14b, the interconnection parts 16, the first and second connection parts 18a and 18b and the side surface of each light emitting cell exposed through mesa etching.

When each light emitting cell is formed such that a wide area of the active layer is secured, the luminance and operating voltage of the light emitting element may be improved.

The multi-chip array semiconductor light emitting device according to the embodiments of the present invention may be used as a chip in a module including a substrate having an electrode part such as a printed circuit board. Also, the aforementioned light emitting device and light emitting module may be implemented as an illumination apparatus including a driving unit.

Figure 7A:
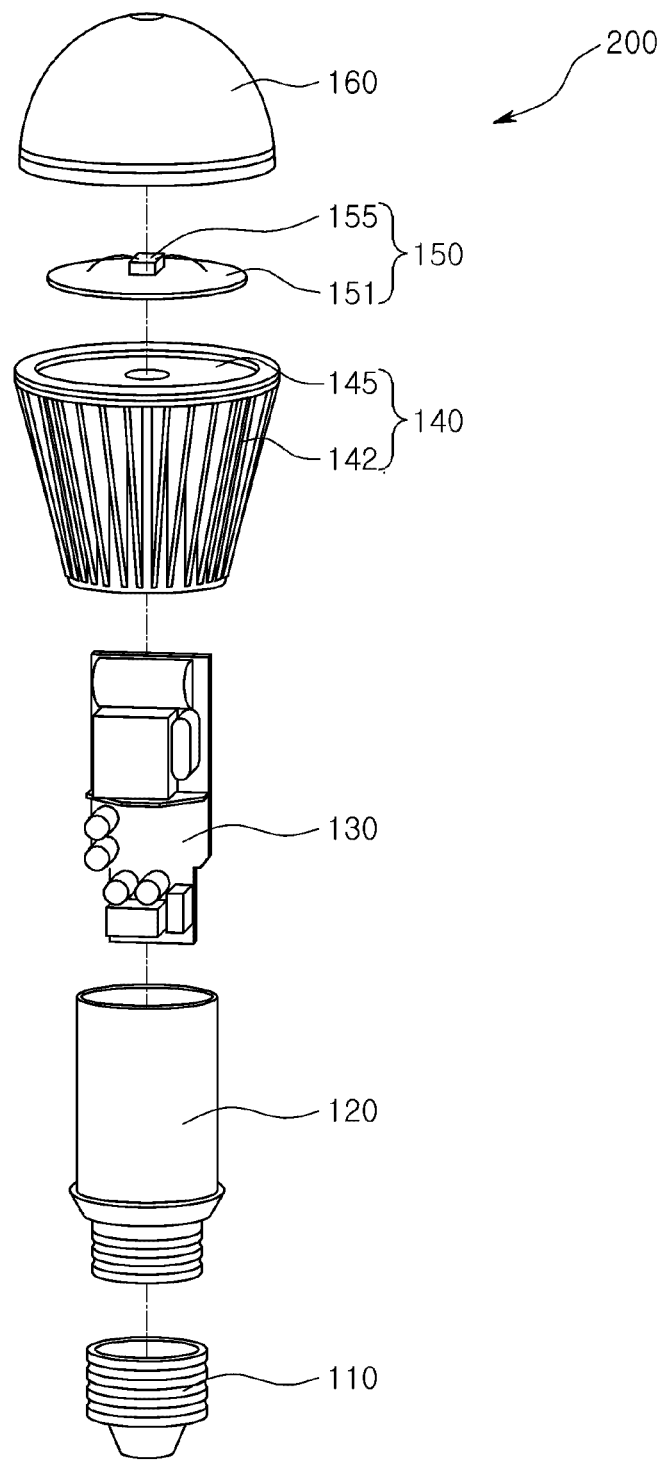
FIGS. 7A and 7B respectively show an exploded perspective view and a schematic perspective view (after assembling) of an illumination apparatus including a multi-cell array semiconductor light emitting device according to an embodiment of the present invention.
Figure 7B:
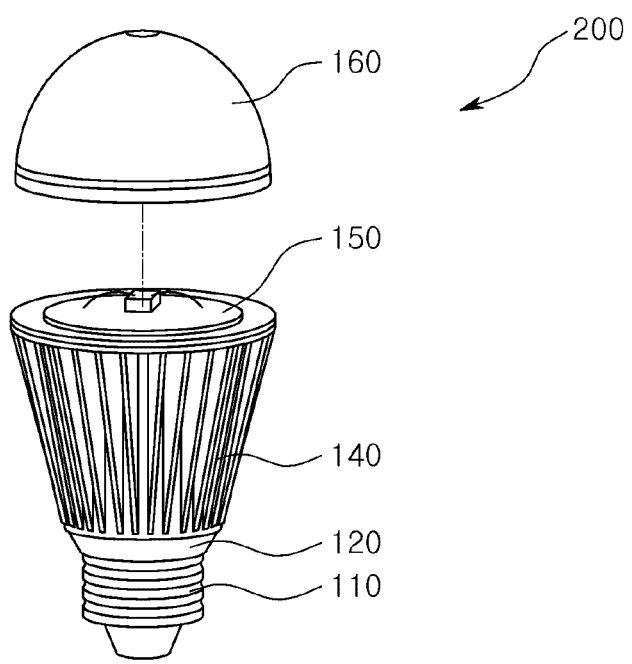

FIGS. 7A and 7B show an illustrative bulb-type lamp as an example of the illumination apparatus according to the present invention. FIG. 7A shows an exploded perspective view of an illumination apparatus, provided to facilitate understanding of components thereof, and FIG. 7B shows an exploded perspective view of the illumination apparatus showing a state in which exploded components are assembled (except for a combination of a convex lens shaped-cover).

Referring to FIGS. 7A and 7B, an illumination apparatus 200 includes a light emitting module 150, a driving unit 130, and an external connection unit 110. The illumination apparatus 200 may further include external structures such as an outer housing 140 and an inner housing 120.

The light emitting module 150 may include a multi-chip array light emitting device 155 and a circuit board 151 having one or more multi-chip array light emitting device(s) 155 mounted thereon. In this embodiment, a single multi-chip array light emitting device 155 is mounted on the circuit board 151; however, the present invention is not limited thereto. That is, a plurality of multi-chip array light emitting devices may be mounted on the circuit board 151.

In the illumination apparatus 200 according to the embodiment, the light emitting module 150 may include the outer housing 140 serving as a heat emission part. The outer housing 140 may include a heat dissipation plate 145 directly connected to and in direct contact with the light emitting module 150 to improve heat dissipation effects. The outer housing 140 may further include heat dissipation member(s) 142, such as fins or blades, that are connected to the heat dissipation plate 145. Also, the illumination apparatus 200 may include a cover part 160 mounted on the light emitting module 150 and having a convex lens shape.

In the embodiment, the driving unit 130 is mounted in the inner housing 120 and connected to the external connection unit 110 such as a socket structure, to receive power from an external power supply unit.

Also, the driving unit 130 may convert the received power into an appropriate current, capable of driving the one or more multi-chip array light emitting device(s) 155 of the light emitting module 150, and provide the current to the multi-chip array light emitting device(s) 155. For example, the driving unit 130 may include an AC-DC converter, a rectifier circuit component, and/or the like.

The abovementioned light emitting device and light emitting module may be used in various apparatuses such as indoor illumination apparatuses (e.g., lamps), outdoor illumination apparatuses (e.g., street lamp and signboards), and traffic illumination apparatuses (e.g., headlamps and rear lamps for vehicles such as cars, airplanes and ships). In addition, the illumination apparatus may further include a heat dissipation member and/or a reflection plate.

As set forth above, according to embodiments of the invention, the area of the active layer 12c can be widened to secure a sufficient light emitting area, thereby improving luminance of the semiconductor light emitting device.

While the present invention has been shown and described in connection with the embodiments, it will be apparent to those skilled in the art that modifications and variations can be made without departing from the spirit and scope of the invention as defined by the appended claims.

What is claimed is:

1. A semiconductor light emitting device, comprising:
    a substrate,
    a plurality of light emitting cells disposed on the substrate, wherein each light emitting cell includes a first conductive semiconductor layer and wherein at least a portion of the first conductive semiconductor layer has an active layer and a second conductive semiconductor layer disposed on a top surface thereof;
    first and second electrodes disposed on the first and second conductive semiconductor layers, respectively, of each light emitting cell among the plurality of light emitting cells;
    an interconnection part connecting the first or second electrode of one light emitting cell to the first or second electrode of another light emitting cell adjacent to the one light emitting cell among the plurality of light emitting cells;
    a first insulation layer covering a surface of at least one light emitting cell among the plurality of light emitting cells and disposed on at least a portion of a surface of the light emitting cell other than a portion thereof facing the first electrode; and
    a second insulation layer disposed on the first insulation layer so as to entirely cover at least one light emitting cell among the plurality of light emitting cells.

2. The semiconductor light emitting device of claim 1, wherein in each light emitting cell among the plurality of light emitting cells, the first insulation layer is not formed between the first electrode and a side surface of the light emitting cell facing the first electrode.

3. The semiconductor light emitting device of claim 1, wherein the first insulation layer and the second insulation layer are formed of silicon oxide or silicon nitride.

4. The semiconductor light emitting device of claim 1, further comprising:
    a transparent electrode disposed on a top portion of the second conductive semiconductor layer of each light emitting cell of the plurality of light emitting cells.

5. The semiconductor light emitting device of claim 1, wherein the first and second electrodes are disposed on top surfaces of each light emitting cell of the plurality of light emitting cells.

6. The semiconductor light emitting device of claim 1, wherein the first insulation layer is not formed on a top portion of the second conductive semiconductor layer having the second electrode disposed thereon in each light emitting cell among the plurality of light emitting cells.

7. The semiconductor light emitting device of claim 1, wherein at least two light emitting cells are interconnected in series by the light emitting cells' first and second electrodes between a positive terminal and a negative terminal of the semiconductor light emitting device.

8. The semiconductor light emitting device of claim 7, wherein a first series interconnection of at least two light emitting cells is coupled in parallel with a second series interconnection of at least two light emitting cells between the positive terminal and the negative terminal of the semiconductor light emitting device.

9. The semiconductor light emitting device of claim 1, wherein the active layer and the second conductive semiconductor layer of each light emitting cell are disposed in a U-shape pattern on the top surface of the light emitting cell, and the first electrode is disposed in the gap of the U-shape pattern on the top surface of the light emitting cell.

10. The semiconductor light emitting device of claim 9, wherein the first insulation layer is disposed on each light emitting cell such that the first insulation layer does not cover any portion of the gap in the U-shape pattern.

* * * * *